United States Patent [19]

Tran et al.

[11] Patent Number: 5,029,136
[45] Date of Patent: Jul. 2, 1991

[54] HIGH-SPEED DRAM SENSE AMP WITH HIGH NOISE IMMUNITY

[75] Inventors: Hiep V. Tran, Carrollton; Hugh P. McAdams, Houston, both of Tex.

[73] Assignee: Texas Instruments Incorporated, Dallas, Tex.

[21] Appl. No.: 423,534

[22] Filed: Oct. 16, 1989

Related U.S. Application Data

[63] Continuation of Ser. No. 125,640, Nov. 25, 1987, abandoned.

[51] Int. Cl.⁵ .................................................. G11C 7/06
[52] U.S. Cl. .................................... 365/205; 365/202; 307/530
[58] Field of Search .......... 365/202, 205, 208, 189.05, 365/189.11; 307/530

[56] References Cited

U.S. PATENT DOCUMENTS 4,716,320 12/1987 McAdams ........................... 365/205
4,816,706 3/1989 Dhong et al. ...................... 365/205

OTHER PUBLICATIONS

IBM Techanical Disclosure Bulletin-vol. 25, No. 10, Mar. 1983, pp. 5088-5091.

Primary Examiner—James W. Moffitt
Attorney, Agent, or Firm—Ronald O. Neerings; Thomas W. DeMond; Melvin Sharp

[57] ABSTRACT

A sense amplifier (10) has P channel transistors (38,48) connected between first and second nodes (34,44) of the sense amplifier and respective bitlines (12,14). The gates (42,52) of the P channel transistors (38,48) are connected to ground. As the voltage at one of the nodes (34 or 44) approaches ground voltage during the sensing operation, the bitline (12 or 14) is effectively disconnected from the sense amplifier (10) thereby increasing sensing speed while reducing noise between the bitline and the node.

7 Claims, 1 Drawing Sheet

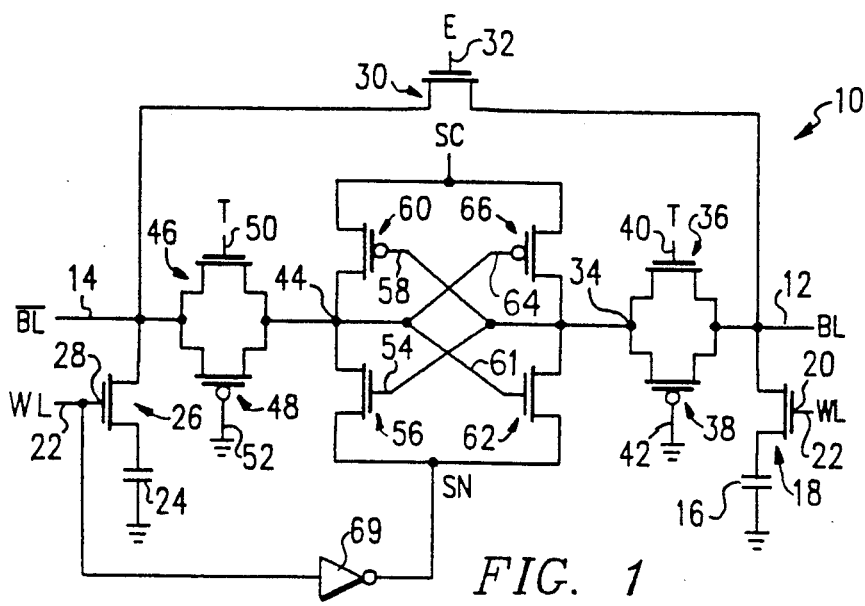
FIG. 1
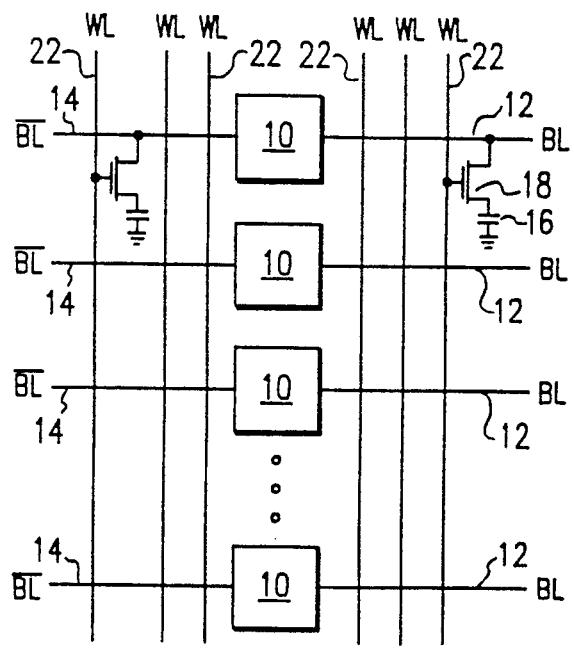
FIG. 3
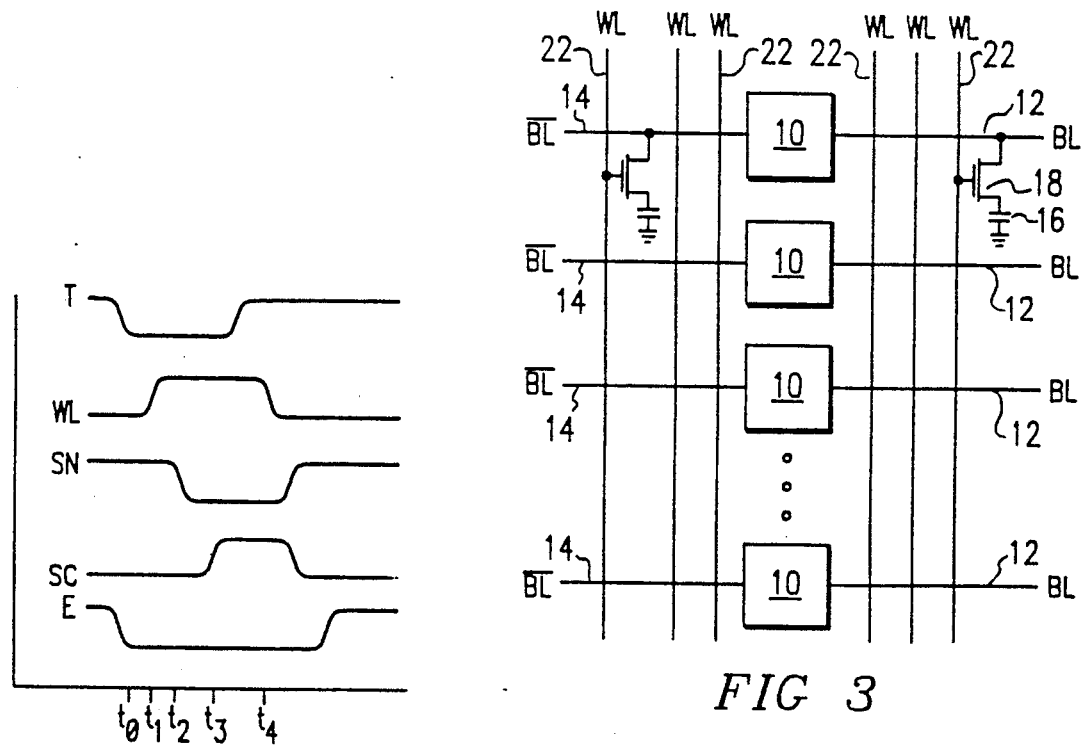
FIG. 2a
FIG. 2b

HIGH-SPEED DRAM SENSE AMP WITH HIGH NOISE IMMUNITY

This application is a continuation of application Ser. No. 07/125,640, filed Nov. 25, 1987, now abandoned.

TECHNICAL FIELD OF THE INVENTION

This invention pertains in general to semiconductor memories, and more particularly to a method and apparatus for providing an isolated sense amplifier for dynamic random access memories.

BACKGROUND OF THE INVENTION

Dynamic memory devices employ sense amplifiers which detect the amount of charge stored in a memory cell by sensing a small change in voltage on a bitline to which the memory cell is connected. Because a large number of cells are connected to each bitline, and since the size of the memory cells have been decreased as the storage capacities have increased, the voltage change on the bitline attributable to the charge stored in the memory cell is very small. Therefore, sense amplifiers must be isolated from the bitlines during read operations in order to prevent noise on the bitline from affecting the sensing operation.

Previously developed sense amplifiers use an N channel transistor to isolate the bitlines from the sense amplifier. The "T signal" used to switch the N channel transistors on and off produces random noise, which may upset the balance of the sense amplifier. Thus, the means of isolating the sense amplifier from the bitlines contributes to additional random noise.

Aside from random noise, the bitlines also couple a high capacitance to the sense amplifier which reduces the sensing speed. Therefore, it is desirable to uncouple the sensing amplifier from the bitlines as soon as the sensing amplifier has locked in the appropriate signals. The previously developed sensing amplifier circuits are not capable of automatically isolating the amplifier, and therefore, inhibit the sensing speed.

Therefore, a need has arisen for a sensing amplifier circuit which effectively isolates the sensing amplifier from the bitlines of a dynamic memory array once the appropriate data value has been latched by the sense amplifier.

SUMMARY OF THE INVENTION

In accordance with the present invention, a sense amplifier is provided which substantially eliminates or prevents the disadvantages and problems associated with prior sense amplifiers.

The sense amplifier of the present invention provides isolating circuitry between the latching circuitry of the sense amplifier and the bitlines connected to the memory cells. The isolating circuitry automatically disconnects the bitlines from the latching circuitry as the voltages are being latched. This provides the technical advantage that noise is automatically isolated from the latching circuitry during the sense operation, thereby reducing noise and capacitance attributable to the bitline.

In another aspect of the present invention, the isolating circuitry comprises P channel transistors connected between the latching circuitry and the bitlines, each P channel transistor having its gate connected to ground or other voltage. As the source of either P channel transistor is pulled low, the P channel transistor will turn off, thereby isolating the bitline from the latching circuitry.

BRIEF DESCRIPTION OF THE DRAWINGS

For a more complete understanding of the present invention and the advantages thereof, reference is now made to the followings descriptions taken in conjunction with the accompanying drawings in which:

FIG. 1 illustrates a circuit diagram of the sense amplifier of the present invention;

FIG. 2a-b illustrate timing diagrams of the signals applied to the sensing amplifier; and FIG. 3 illustrates a block diagram of an array of sense amplifiers in an open architecture.

DETAILED DESCRIPTION OF THE INVENTION

The preferred embodiment of the present invention is best understood by referring to FIGS. 1-3 of the drawings, like numerals being used for like and corresponding parts of the various drawings.

FIG. 1 illustrates a circuit diagram of the sense amplifier of the present invention. The sense amplifier, generally indicated by reference numeral 10, is connected to a bitline 12 and an inverted bitline 14. The bitline 12 is connected to a memory cell 16 via an N channel transistor 18. The gate 20 of the N channel transistor 18 is connected to a wordline 22. The inverted bitline 14 is connected to dummy memory cell 24 via an N channel transistor 26. The gate 28 of the N channel transistor 26 is also connected to the wordline 22.

The bitline 12 is connected to the inverted bitline 14 through an N channel transistor 30, having its gate 32 connected to the Equalize signal (E). The bitline 12 is connected to a sense node 34 via an N channel transistor 36 and a P channel transistor 38. The gate 40 of the N channel transistor 36 is connected to a "T" signal and the gate 42 of the P channel transistor 38 is connected to ground, or another appropriate voltage. The inverted bitline 14 is connected to a sense node 44 via an N channel transistor 46 and a P channel transistor 48. The gate 50 of the N channel transistor 46 is connected to the "T" signal, and the gate 52 of the P channel transistor 48 is connected to ground.

Node 34 is connected to the gate 54 of an N channel transistor 56 and to the gate 58 of a P channel transistor 60. Node 44 is connected to the gate 61 of an N channel transistor 62 and to a gate 64 of a P channel transistor 66. The N channel transistor 56 connects the node 44 with a Select Normal signal (SN). The SN signal is connected to wordline 22 through inverter 69, or alternatively, connected to a clock signal. P channel transistor 60 connects node 44 with a Select Complement signal (SC). P channel transistor 66 connects node 34 with the SC signal and N channel transistor 62 connects node 34 with the SN signal. Signals WL, SN, SC, and T are dependent upon clock signals (not shown).

The configuration of sense amplifiers in an array is described in detail in U.S. Pat. No. 4,081,701 to White et al., which is incorporated herein by reference.

The operation of the sense amplifier 10 is best described in conjunction with FIGS. 2a-b. In an initial state, the T signal is high, the WL signal is low, the SN signal is high, the SC signal is low or at $V_{cc}/2$ level, and the E signal is high. The E signal is used to equalize the voltage on the bitline 12 and the inverted bitline 14 to a voltage of approximately $V_{cc}/2$. Once this is achieved, the E signal may be pulled low to turn off the N channel transistor 30 in order to uncouple the bitline 12 from the inverted bitline 14. The T signal operates to connect the bitline to the node 34 through N channel transistor 36 and to connect the inverted bitline 14 to the node 44 through N channel transistor 46. At this time, the actual value of the T signal is irrelevant, since the signals on the bitline 12 and inverted bitline 14 pass to the nodes 34 and 44 through the P channel transistors 42, 38 and 48 respectively. Since the bitline 12 and inverted bitline 14 have a voltage of $V_{cc}/2$, nodes 34 and 44 also have a voltage of $V_{cc}/2$ as indicated in FIG. 2b. At time $T_0$, the T signal and E signal are pulled low, thus placing the N channel transistors 30, 36 and 46 in non-conducting states. It is not important to the operation of the sense amplifier 10 that the T signal and E signal be pulled down simultaneously. The order in which they are pulled low also is not important.

At time $T_1$, the WL signal is pulled high, thus connecting the memory cell 16 to the bitline 12 and the dummy memory cell 24 to the inverted bitline 14. The effect of turning the N channel transistors 18 and 26 on is to create an imbalance between the bitline 12 and inverted bitline 14. If a logical "1" value was stored in the memory cell 16, the voltage on the bitline 12 will increase by about 100 millivolts. On the other hand, if a logical "0" was stored in the memory cell 16, the voltage on the bitline 12 would be decreased by about 100 millivolts. The dummy cell is precharged before every active cycle to a preset voltage level, which always places the inverted bitline 14 between logic "1" and logic "0" of bitline 12 during active cycles.

At time $T_2$, the SN signal is pulled low. The N channel transistors 56 and 62 act as a latch, amplifying the imbalance between the bitline 12 and inverted bitline 14. For example, if the voltage at node 34 is higher than the voltage at node 44, the N channel transistor 56 will turn on more strongly than the N channel transistor 62. Hence, the N channel transistor 56 will conduct from node 44 to ground (SN is at ground), thereby reducing the voltage at node 44 to ground. As the voltage at node 44 is reduced, the voltage at the gate 61 of the N channel transistor 62 is correspondingly reduced, thus turning off N channel transistor 62. Since N channel transistor 62 is turned off, the voltage at node 34 will remain around $V_{cc}/2$.

As the bitline and the node on the "low side" of the sense amplifier (node 44 and bitline 14 in the example) is pulled low, the $V_{gs}$ of the P channel transistor 48 or 42 ($V_{gs}$ being the voltage between the transistor gate and source) is correspondingly reduced to the point where the associated P channel transistor 48 or 42 is turned off completely once the $V_{gs}$ of the P channel transistor 48 or 42 reaches its $V_t$ level. This has two effects. The first effect is to isolate the sense amplifier 10 from the bitline 12 or 14 associated with the low side as soon as the data is latched by the N channel transistors 56 and 62. The second effect is to prevent the bitline 12 or 14 associated with the low side from being pulled low until the corresponding N channel transistor 36 or 46 is turned on by a high T signal.

At time $T_3$, the SC signal is pulled high. Prior to this time, both P channel transistors 60 and 66 were turned off, since the SC signal was low. As the SC signal is pulled high, the P channel transistor 60 or 66 having its gate 58 or 64 connected to the low side node 34 or 44 is turned on, and the complementary P channel transistor is turned off. Thus, in the example above with the node 34 being the high side node and the node 44 being the low side node, the P channel transistor 66 would be turned on and the P channel transistor 60 would be turned off. Thus, the P channel transistor 66 would connect the high side node 34 to the SC signal, and the high side node 34 will be pulled high to a voltage of about $V_{cc}$. Since the P channel transistor 38 is still turned on, the bitline 12 would also be pulled high to $V_{cc}$.

At time $T_4$, the T signal is pulled high, turning on the N channel transistors 36 and 46. This allows the voltage at the low side node to be connected to its associated bitline. In the example, the node 44, at ground voltage, would be connected to the inverted bitline 14. At this point, both bitlines 12 and 14 are at the appropriate voltage and the voltage in the memory cell 16 may be restored. Subsequently, the WL signal may be pulled low to disconnect the memory cell 16 and the dummy memory cell 24 from the bitlines 12 and 14, and the SN and SC signals may be pulled high and low (or to $V_{cc}/2$), respectively, to turn off the transistors 56, 60, 62 and 66. The E signal may be pulled high to once again precharge the bitlines 12 and 14 to $V_{cc}/2$.

In previously developed sensing amplifiers, the N channel transistors 36 and 46 were the sole means for disconnecting the bitlines 12 and 14 from the nodes 34 and 44. As the T signal was pulled low to turn the N channel transistors 36 and 46 off, noise was generated by the switching of the T signal which could upset the balance of the sense amplifier. In the present invention, the low side node 34 and 44 is automatically disconnected from its associated bitline 12 or 14 as the data is latched.

In an alternative embodiment, the N channel transistors 36 and 46 are eliminated from the circuit of FIG. 1, and circuitry is connected to the P channel transistors 42 and 48 to pull their gates to a negative voltage at time $T_4$, to connect the low side node to its respective bitline.

Thus, the present invention provides the technical advantage that the bitline 12 or 14 is disconnected from the sense amplifier as soon as data is latched. This eliminates noise from affecting the sensing operation, and increases the speed at which data may be sensed.

FIG. 3 illustrates an array of sense amplifiers in an open architecture, wherein the bitlines 12 are opposite the inverted bitlines 14. In an open architecture, it is possible data on one bitline 12 will feed back into the sense amplifier 10 associated with an adjacent line. This effect is multiplied if a majority of bitlines are going either high or low, while only a few are being pulled in the opposite direction.

Since the sense amplifier 10 of the present invention is isolated from the bitlines 12 and 14 as soon as the data is locked in, the above-described effect is minimized. Thus, the present invention provides the technical advantage of providing effective sense amplifier isolation in an open architecture.

Although the present invention has been described in detail, it should be understood that various changes, substitutions and alterations can be made herein without departing from the spirit and scope of the invention as defined by the appended claims.

What is claimed is:

1. A sense amplifier for a semiconductor memory device for sensing a voltage imbalance between first and second sense nodes comprising:

respective bitlines coupled to the first and second nodes;
memory cells operatively connected to said bitlines;

latching circuitry connected to the first and second nodes for pulling the first and second nodes towards predetermined high and low voltages corresponding to the orientation of the voltage imbalance between sense nodes; and isolating circuitry comprising P channel transistors connected between said nodes and respective bitlines for automatically isolating one of said bitlines from its respective node responsive to a voltage change at that node caused by said latching circuitry.

2. A semiconductor memory device including a sense amplifier for sensing a voltage imbalance between first and second sense nodes in the semiconductor memory device, the memory device comprising:

respective bitlines coupled to the first and second sense nodes;

memory cells operatively connected to said bit lines;

latching circuitry connected to the first and second sense nodes for changing voltages on the first and second sense nodes towards predetermined high and low voltages corresponding to the orientation of the voltage imbalance between the first and second sense nodes;

first and second grounded gate transistors for coupling the respective bitlines to the first and second sense nodes and for automatically isolating one of said bitlines from its respective sense node in response to the voltage change at that sense node caused by said latching circuitry.

3. A sense amplifier, in accordance with claim 2, wherein the first and second grounded gate transistors are P channel transistors, each having its conduction channel connected between one of said nodes and its respective bitline.

4. A sense amplifier, in accordance with claim 3, wherein first and second N channel transistors are interconnected with the P channel transistors and circuitry for pulling voltage on the gates of the N channel transistors below said predetermined low voltage to enable conduction between the first and second sense nodes and the respective bitlines.

5. An integrated circuit dynamic random access memory arrangement comprising:

a sense amplifier including first and second nodes;

a first voltage limiting transistor having one end of its conduction path connected to the first node and having a gate electrode connected to a reference potential;

a second voltage limiting transistor having one end of its conduction path connected to the second node and having a gate electrode connected to the reference potential;

a first bitline coupled through the conduction path of the first voltage limiting transistor to the first node;

a second bitline coupled through the conduction path of the second voltage limiting transistor to the second node;

a first plurality of memory cells coupled to the first bitline; and at least one memory cell coupled to the second bitline.

6. An integrated circuit dynamic random access memory arrangement, in accordance with claim 5, wherein the reference potential is ground.

7. An integrated circuit dynamic random access memory arrangement, in accordance with claim 5, wherein the conduction path of either the first or the second voltage limiting transistor automatically is disabled from conducting during each sensing operation.

* * * * *